United States Patent
Hazelton (10) Patent No.: US 6,903,467 B2
(45) Date of Patent: Jun. 7, 2005

(54) TUBE CARRIER REACTION APPARATUS

(75) Inventor: Andrew J. Hazelton, San Carlos, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/339,701

(22) Filed: Jan. 8, 2003

(65) Prior Publication Data

US 2004/0130220 A1 Jul. 8, 2004

(51) Int. Cl.[7] .................. H01L 21/027; G03B 27/62; G03B 24/42
(52) U.S. Cl. ................ 310/12; 74/490.13; 55/53; 55/72
(58) Field of Search .............. 74/471 XY, 490.09, 74/490.13; 310/12, 13, 14; 355/53, 72

(56) References Cited

U.S. PATENT DOCUMENTS

| | | | |
|---|---|---|---|
| 5,623,853 A | 4/1997 | Novak et al. ............ | 74/490.09 |
| 5,862,887 A * | 1/1999 | Swaybill et al. .......... | 187/313 |
| 6,222,614 B1 | 4/2001 | Ohtomo .................. | 355/53 |
| 6,501,500 B1 * | 12/2002 | Olenio et al. ............. | 347/263 |

FOREIGN PATENT DOCUMENTS

JP        2002-43213 A       2/2002

* cited by examiner

Primary Examiner—Darren Schuberg
Assistant Examiner—Judson H. Jones
(74) Attorney, Agent, or Firm—Finnegan, Henderson, Farabow, Garrett & Dunner (57) ABSTRACT

The disclosure relates to an apparatus for manufacturing a product, including a product stage assembly, having a movable product stage, the product stage assembly having at least one input is supplied by at least one tube. A tube carrier assembly for positioning the at least one tube relative to the product stage assembly is also provided along with a reaction apparatus positioned to absorb inertial forces created by tube carrier assembly movement substantially independently of inertial forces created by movable product stage movement. A method of operation therefore is also provided.

33 Claims, 11 Drawing Sheets

TUBE CARRIER REACTION APPARATUS

DESCRIPTION OF THE INVENTION

1. Field of the Invention

The present invention is directed to a stage assembly for moving a device, and, more particularly to a stage assembly including a tube carrier and an associated system for reducing the effect of forces created by movement of the tube carrier on the stage assembly.

2. Background of the Invention

Exposure apparatuses are commonly used to transfer images from a reticle onto a semiconductor wafer during semiconductor processing. A typical exposure apparatus includes an illumination source, a reticle stage assembly that retains a reticle, a lens assembly and a wafer stage assembly that retains a semiconductor wafer. The reticle stage assembly and the wafer stage assembly are supported above the ground by an apparatus frame.

Typically, the wafer stage assembly includes a wafer stage base, a wafer stage that retains the wafer, and a wafer stage mover assembly that precisely positions the wafer stage and the wafer. Somewhat similarly, the reticle stage assembly includes a reticle stage base, a reticle stage that retains the reticle, and a reticle stage mover assembly that precisely positions the reticle stage and the reticle. The size of the images transferred onto the wafer from the reticle are extremely small. Accordingly, the precise relative positioning of the wafer and the reticle is critical to the manufacturing of high density, semiconductor wafers.

Unfortunately, the wafer stage mover assembly generates inertial forces that can vibrate the wafer stage base and the apparatus frame. The vibration may influence the position of the wafer stage base, the wafer stage, and the wafer. As a result, the vibration can cause an alignment error between the reticle and the wafer. This reduces the accuracy of positioning of the wafer relative to the reticle and degrades the accuracy of the exposure apparatus.

The wafer stage movers also require numerous inputs to operate. Some of these inputs include, flexible conduits, such as pressurized air lines, vacuum lines, and/or electrical lines. In some prior art machines, these input conduits are connected from the wafer stage to a fixed point located on the stage assembly itself. The conduits, commonly referred to as tubes, may have an additional spring force associated with them as they coil and uncoil or bend and straighten. If one end of the plurality of conduits is fixed in relation to the end connected to the wafer stage mover, the forces generated by bending and unbending of the conduits can also introduce undesired forces that may lead to misalignment between the reticle and the wafer stage.

In an effort to reduce the effect of such forces, a conduit or tube carrier, may be added to the stage assembly that is capable of moving along with the wafer stage. In this configuration, the various input conduits remain in a neutral position between the tube carrier and the wafer stage assembly and thus reduce the introduction of such undesirable forces into the wafer stage mover. Typically, this tube carrier comprises a plurality of conduits, or tubes, connected into a housing that moves along in conjunction with the wafer stage mover to supply the necessary inputs.

The movement of the tube carrier, however, may also create undesirable forces that could be isolated so as not to interfere with the focusing of the image on the wafer. Currently, if employed, these tube carriers may be connected to the wafer stage assembly. Existing reaction frame or reaction mass assemblies associated with these machines are capable of reducing some of the inertial forces associated with the movement of the tube carrier, but the direct connection to the stage assembly may introduce undesirable forces that cannot be compensated for using existing reaction assemblies. It would be desirable to create a system capable of isolating substantially all of the force created within the wafer stage assembly as well as the force generated by the tube carrier.

SUMMARY OF THE INVENTION

The advantages and purpose of the invention will be set forth in part in the description that follows, and in part will be obvious from the description, or may be learned by practice of the invention. The advantages and purpose of the invention will be realized and attained by means of the elements and combinations particularly pointed out in the appended claims.

To attain the advantages and in accordance with the purpose of the invention, as embodied and broadly described herein, the invention concerns an apparatus for manufacturing a product, including a product stage assembly, having a movable product stage, the product stage assembly having at least one input supplied by at least one tube. A tube carrier assembly for positioning the at least one tube relative to the product stage assembly is also provided along with a reaction apparatus positioned to absorb inertial forces created by tube carrier assembly movement substantially independently of inertial forces created by movable product stage movement.

According to another aspect, the invention includes a method of operating a product stage assembly includes independently positioning a tube carrier assembly in conjunction with movement of a movable product stage to which at least one input from is supplied from at least one tube. In addition, inertial forces created by tube carrier assembly movement substantially independently of inertial forces created by movable product stage movement are absorbed.

Additional aspects of the invention will be set forth in part in the description which follows, and in part will be obvious from the description, or may be learned by practice of the invention. The aspects of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention and are incorporated in and constitute a part of this specification. The drawings illustrate exemplary embodiments of the invention and, together with the description, serve to explain certain principles. In the drawings.

DESCRIPTION OF THE EMBODIMENTS

Reference will now be made in detail to exemplary embodiments of the invention, examples of which are illustrated in the accompanying drawings.

Wherever possible, the same reference numbers will be used throughout the drawings to refer to the same or like parts.

A general retention system of the present invention will be described with reference to the exposure apparatus 22 shown in FIG. 1. As shown, the exposure apparatus 22 includes a frame 24 supporting the components of the system, including an illumination system 26, a reticle stage 28, a lens assembly projection optical system 30, and a wafer stage 32. The frame 24 is rigid and mounts to a base, such as the floor or another supporting structure. The design of the apparatus frame 24 may vary to suit the design requirements for the rest of the exposure apparatus 22. For example, separate individual structures (not shown) can be used to support the components of the system.

In operation, the exposure apparatus 22 utilizes the illumination system 26 to transfer a pattern of an integrated circuit from a reticle 34 mounted on the reticle stage 28, through the lens assembly projection optical system 30, and onto a semiconductor wafer 36 mounted on the wafer stage 32.

Figure 1:
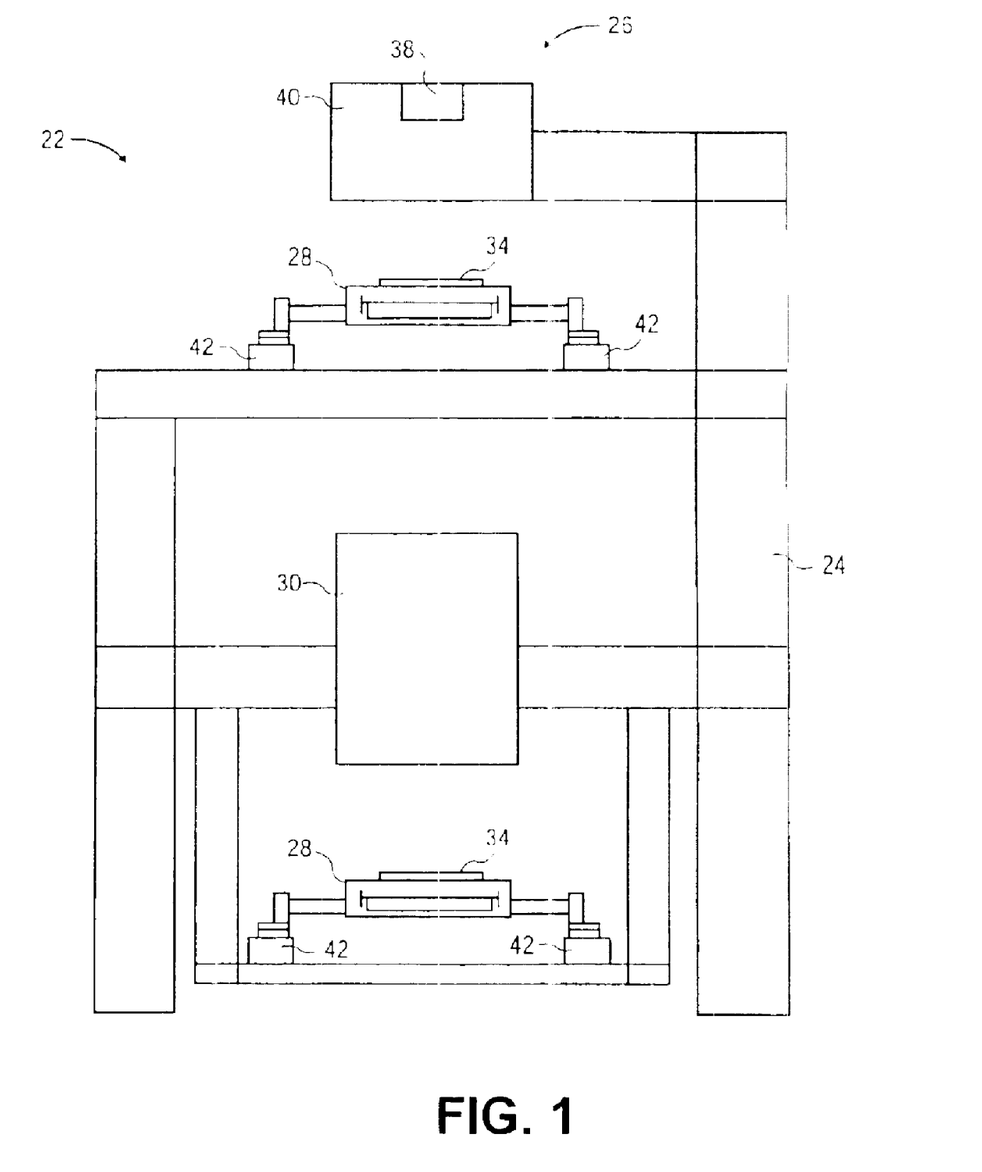
FIG. 1 is a largely schematic front elevation illustrating a semiconductor manufacturing device incorporating the retention system of the present invention.

The illumination system 26 includes an illumination source 38 and an illumination optical assembly 40, as shown in FIG. 1. The illumination source 38 emits a beam of light energy. The illumination optical assembly 40 guides the beam of light energy from the illumination source 38 to the lens assembly projection optical system 30. The beam selectively illuminates different portions of the reticle 34 and exposes the wafer 36. In FIG. 1, the illumination source 38 is illustrated as being supported above the reticle stage 28. Alternatively, the illumination source 38 can be secured to one of the sides of the apparatus frame 24 and the energy beam from the illumination source 38 can be directed above the reticle stage 28 with the illumination optical assembly 40.

The illumination source 38 can be a g-line light (436 nm), an i-line light (365 nm), a KrF excimer laser (248 nm), an ArF excimer laser (193 nm), or an $F_2$ laser (157 nm). Alternatively, the illumination source 38 can use a charged particle beam, such as an X-ray or an electron beam. In the case where an electron beam is used, thermionic emission-type lanthanum hexaboride ($LaB_6$) or tantalum (Ta) can be used as an electron gun. Further, in the case where an electron beam is used, the structure can be such that either a reticle is used, or a pattern is formed directly on the wafer without the use of a reticle.

The reticle stage 28 holds and precisely positions the reticle 34 relative to the lens assembly projection optical system 30 and the wafer 36.

The lens assembly projection optical system 30 projects and/or focuses the light passing through the reticle 34 to the wafer 36. Depending upon the design of the apparatus 22, the lens assembly projection optical system 30 can reduce the image illuminated on the reticle 34 by varying amounts.

With respect to the lens assembly projection optical system 30, when an excimer laser having far ultra-violet rays is used, glass materials such as quartz and fluorite that transmit far ultra-violet rays are preferably used. When an $F_2$ type laser or an X-ray is used, the lens assembly projection optical system 30 should preferably be either catadioptric or refractive (a reticle should also preferably be a reflective type), and when an electron beam is used, electron optics should preferably comprise electron lenses and deflectors. The optical path for the electron beams should be in a vacuum Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377, as well as Japan Patent Application Disclosure No. 10-3039, also use a reflecting-refracting type of optical system incorporating a concave mirror, but without a beam splitter, and can also be employed with this invention. The disclosures in the above-mentioned U.S. patents, as well as the Japan patent applications published in the Official Gazette for Laid-Open Patent Applications are incorporated herein by reference.

The wafer stage 32 holds and positions the wafer 36 with respect to the projected image of the illuminated portions of the reticle 34. In the embodiment illustrated in FIG. 1, the wafer stage 32 and the reticle stage 28 are positioned by a plurality of motors 42. Depending upon the design, the apparatus can also include additional servo drive units, linear motors, and planar motors to move the wafer stage 32 and the reticle stage 28.

When linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage can move along a guide, or it can be a guideless-type stage. The disclosures in U.S. Pat. Nos. 5,623,853 and 5,528,118 are incorporated herein by reference.

Alternatively, a stage can be driven by a planar motor, which drives the stage by the electromagnetic force generated by a magnet unit having two-dimensionally arranged magnets and an armature coil unit having two-dimensionally arranged coils in facing positions. With this type of driving system, either one of the magnet unit or the armature coil unit is connected to the stage, and the other unit is mounted on the moving plane side of the stage.

Movement of the stages, as described above, generates reaction or inertial forces that can affect performance of the photolithography system. Inertial forces generated by the wafer stage motion can be released mechanically to the floor by the use of a frame member as described in U.S. Pat. No. 5,528,118 and published Japanese Patent Application Disclosure No. 8-166475. Additionally, inertial forces generated by the reticle stage motion can be mechanically released to the floor by use of a frame member as described in U.S. Pat. No. 5,874,820 and published Japanese Patent Application Disclosure No. 8-330224. In addition to these reaction frames, it is also possible to use a reaction mass assembly. The disclosures in the above referenced U.S. Patents, U.S. Patent Applications, and Japanese Applications are incorporated herein by reference.

There are several different types of photolithographic devices. For example, the exposure apparatus 22 can be used as a scanning type photolithography system which exposes the pattern from the reticle 34 onto the wafer 36 with the reticle 34 and the wafer 36 moving synchronously. In a scanning type lithographic device, the reticle 34 is moved perpendicularly to an optical axis of the lens assembly projection optical system 30 by the reticle stage 28 and the wafer 36 is moved perpendicularly to an optical axis of the lens assembly projection optical system 30 by the wafer stage 32. Scanning of the reticle 34 and the wafer 36 occurs while the reticle 34 and the wafer 36 are moving synchronously.

Figure 2:
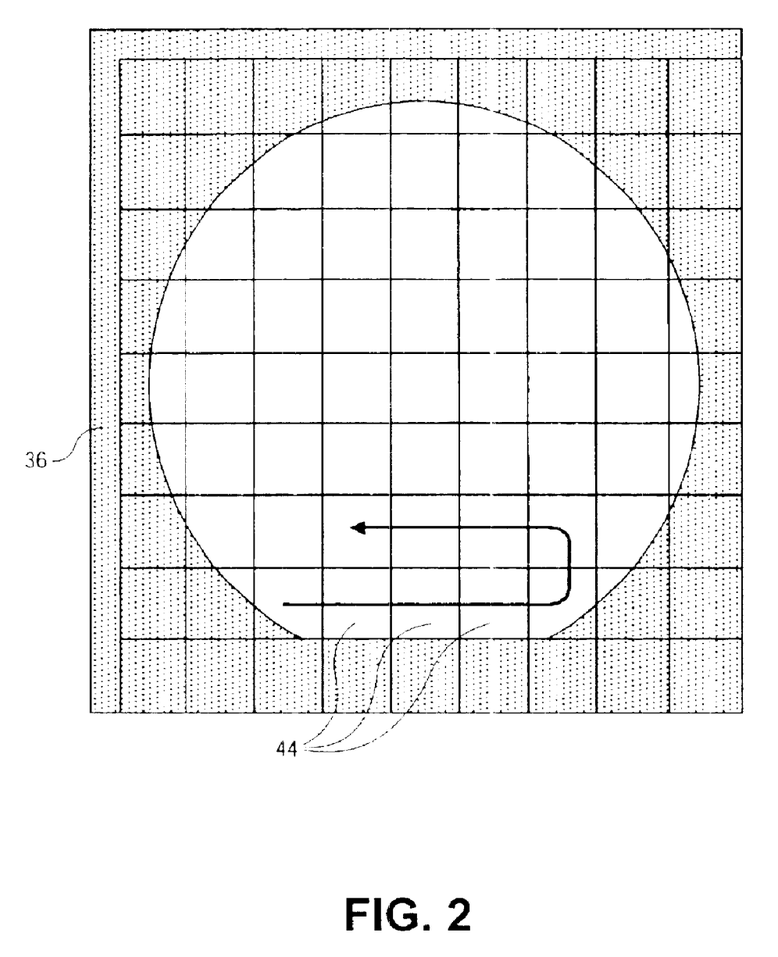
FIG. 2 is a plan view illustrating a wafer to be used in conjunction with the semiconductor manufacturing device of FIG. 1.

Alternatively, the exposure apparatus 22 can be a step-and-repeat type photolithography system, or stepper, that exposes the reticle 34 while the reticle 34 and the wafer 36 are stationary. In the step-and-repeat process, the wafer 36 is in a constant position relative to the reticle 34 and the lens assembly projection optical system 30 during the exposure of an individual field, or die 44. The wafer 36 used with a stepper system has multiple dies 44 arranged on the surface of the wafer, as shown in FIG. 2.

Between exposure steps, the computer-controlled wafer stage 32 sequentially advances the wafer 36 perpendicularly to the optical axis of the lens assembly projection optical system 30 so that the next die 44 is brought into position relative to the lens assembly projection optical system 30 and the reticle 34 for exposure. The image on the reticle 34 is sequentially exposed onto the dies 44 of the semiconductor wafer 36 as each die 44 is brought into position. The wafer stage 32 advances the dies 44 for exposure in a boustrophedonic motion, wherein alternate rows are advanced in opposite directions. The motion of wafer 36 is indicated by the arrow in FIG. 2.

Each exposed layer of a die 44 represents a single layer of a multi-layer integrated circuit. The exposure process is repeated to overlay additional circuit patterns on each die 44, whereby each die 44 is processed into a multi-layer integrated circuit.

Figure 3:
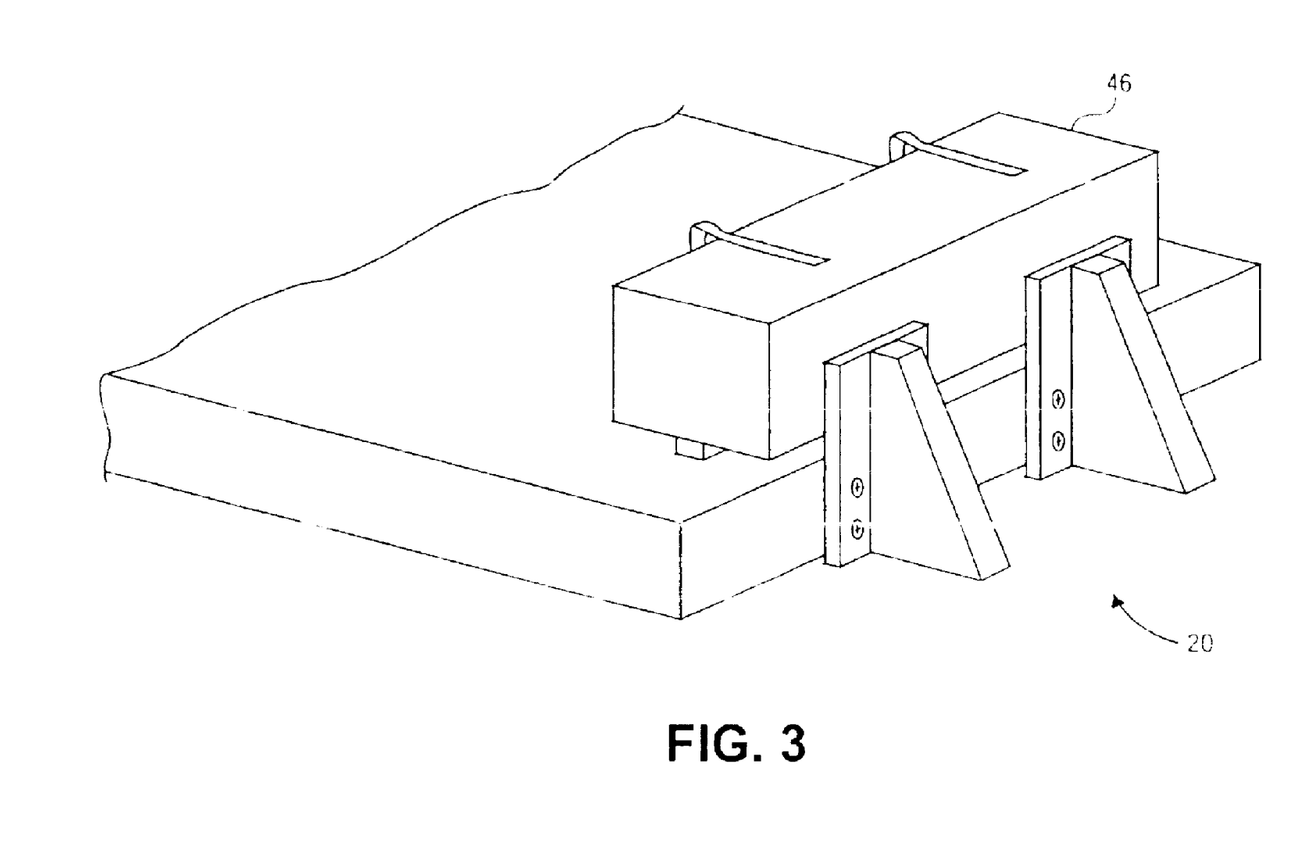
FIG. 3 is a perspective view illustrating a retention system for use with the semiconductor manufacturing device of FIG. 1.

During the exposure process and the overlay process, precise positioning of the wafer stage 32 is necessary to achieve the required manufacturing tolerances. Stepper devices use laser interferometers, which detect the position of a detection member, such as a stage mirror 46, to precisely determine and control the position of the wafer stage 32 during manufacturing. Each stage mirror 46 can be used to detect the position of the wafer stage 32 in one of three orthogonal directions. Multiple stage mirrors 46 can be used to detect the position of the wafer stage 32 in multiple directions. A wafer stage 32 with a single stage mirror 46 is shown in FIG. 3. As shown, the stage mirror 46 is secured on the wafer stage 32 with an embodiment of the retention system 20.

Figure 4:
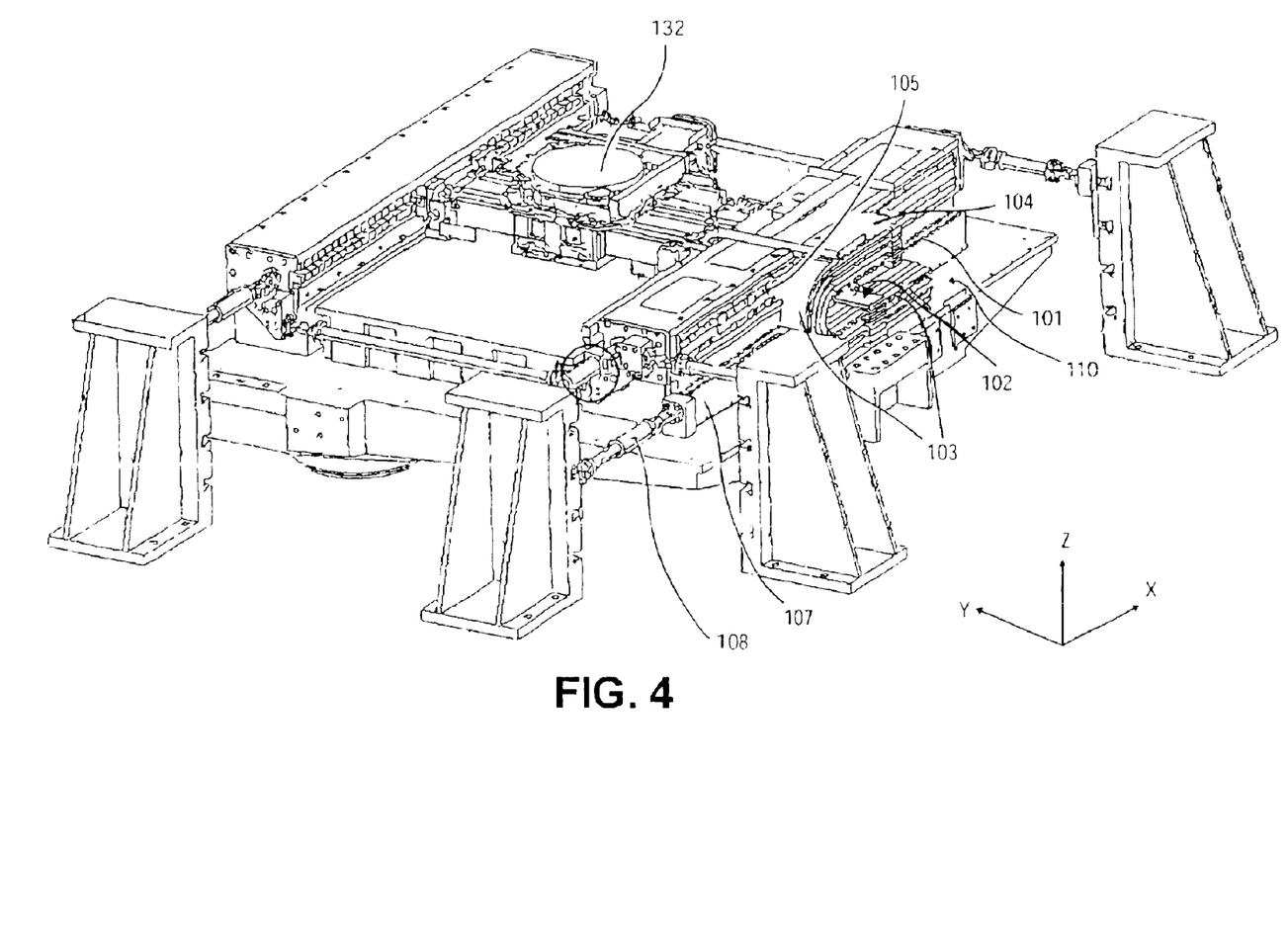
FIG. 4 is a perspective view illustrating a wafer stage assembly portion of a semiconductor manufacturing device with a reaction frame and a tube carrier.
Figure 4A:
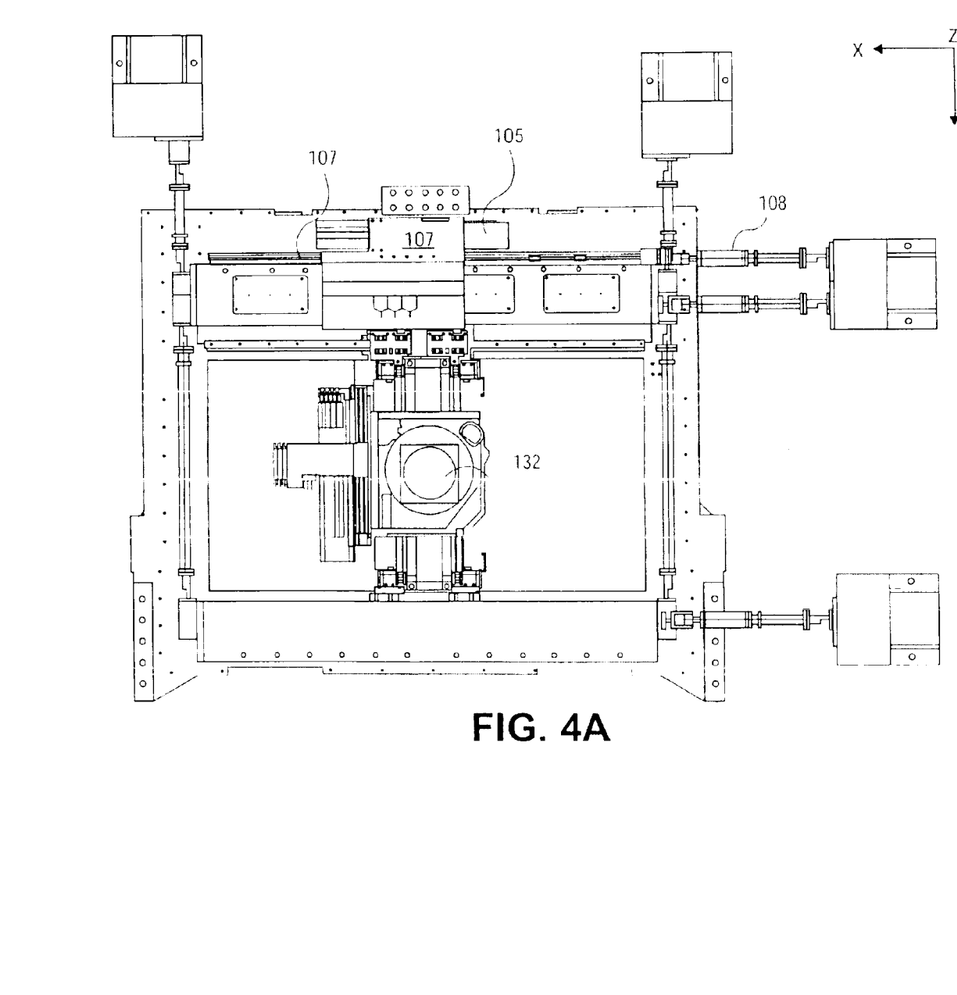
FIG. 4a is a plan view of the wafer stage assembly portion of FIG. 4.

A tube carrier assembly for the wafer stage assembly will now be described in relation to a stage assembly as depicted in FIGS. 4 and 4a. As described above, an external tube carrier 100 is associated with movable wafer stage 132 and is depicted having a movable tube carrier portion 101 and a lower fixed portion 102 with a plurality of conduits or tubes 103 running therebetween. These conduits may be used to supply inputs such as vacuum or air power as well as electricity electric power, for example. Conduits 103 may be formed of a semi-rigid material, for example, that when in a bent or flexed position create a spring force that is transmitted from the tube carrier into the stage assembly. Conduits 103 may be any form of input transmission line known in the art. As depicted, this tube coil is in the form of a U-shaped coil. Lower tube carrier portion 102 is usually in a fixed position with upper tube carrier portion 101 connected to a tube stage 104. Tube stage 104 interfaces and provides the inputs from the conduits 103 to the internal portion of the stage assembly where the photolithography or other process(es) is/are carried out. Although, this stage assembly is described herein in regard to photolithography, the general concepts employed may be applicable to other manufacturing process besides those associated with manufacturing a wafer.

Tube stage 104 is configured to ride along a tube stage guide 105 and is propelled by a linear motor as commonly used in the semiconductor fabrication field and described above. The linear motor depicted in FIGS. 4–7 comprises a motor having motor coil 106 (see FIG. 5) that rides in a u-shaped stator magnet channel 107 to provide linear motion in the x-direction, although other linear motors may be used. Tube stage 104 may then move correspondingly with the movement of wafer stage 132. As described above, in this configuration, the forces created by deflection of the tubes 103 are not as readily transferred directly into the wafer stage assembly.

Although this may reduce forces created by the flexing of the conduits 103, additional forces may be created in the x-direction due to the movement of the motor coil 106 and the subsequent reaction or inertial force from magnet channel 107. To reduce any effect on wafer stage 132, it may be desirable to add an additional flexure assembly 108 to the reaction frame along a movement axis of magnet channel 107 to absorb these inertial forces. In addition, an entirely separate reaction frame could be used to support flexure assembly 108 independent of the reaction frame for the remainder of the lithography apparatus.

Figure 5:
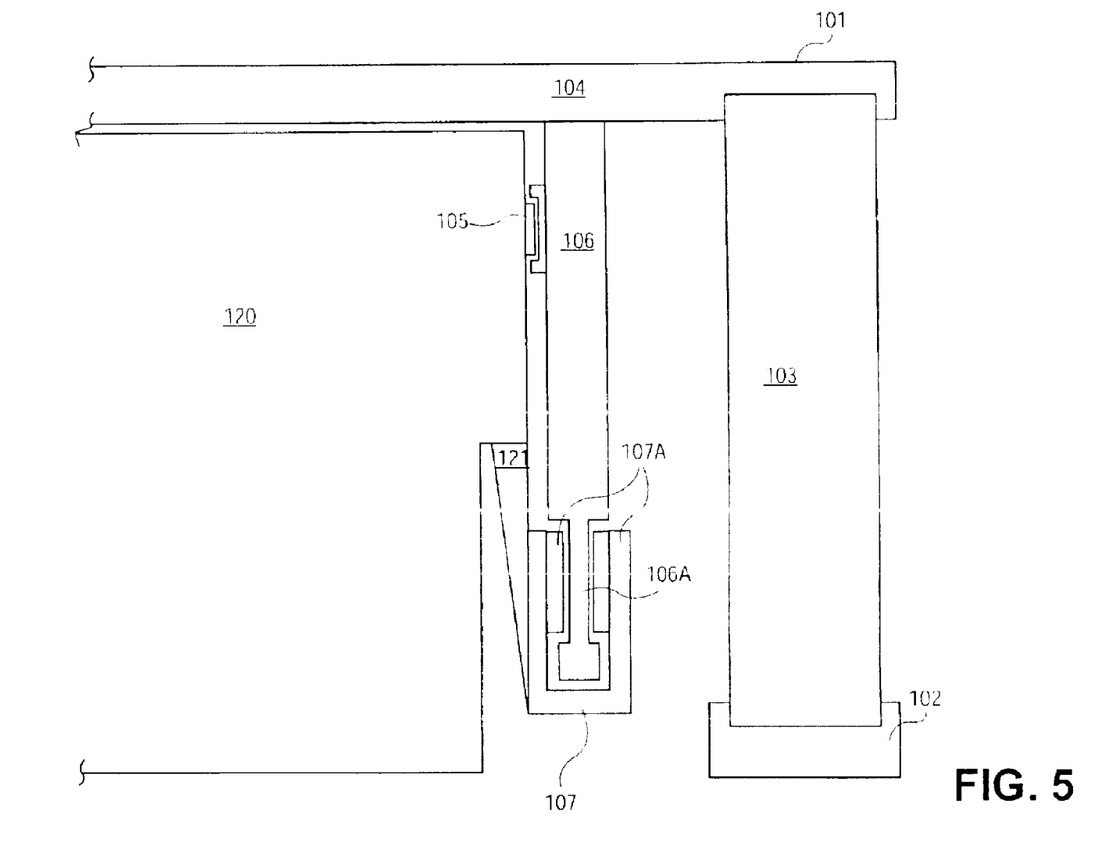
FIG. 5 is an end view illustrating the wafer stage assembly of FIG. 4.

As seen in FIG. 5, a bottom portion 106a of motor coil 106 rides along a motor magnet assembly 107a. Magnet assembly 107a extends along an interior of magnet channel 107, which extends along the side of the stage assembly a distance long enough to allow tube stage 104 to traverse the same distance that movable wafer stage 132 is capable of traversing.

Located at one end of the magnet channel 107 is tube carrier reaction rod flexure assembly 108. Reaction rod flexure assembly 108 may comprise a flexure assembly as depicted or any other suitable device known in the art for transmitting the inertial force(s) from magnet channel 107 to ground. Reaction rod flexure assembly 108 is positioned so as to absorb inertial force(s) in the x-direction to counteract the force generated as tube stage 104 moves in the x-direction. When motor coil 106 and upper tube carrier 101 move in one direction, magnet channel 107 reacts by moving in the opposite direction. Reaction rod flexure assembly 108 is positioned to absorb at least a portion of the inertial force of magnet channel 107. In the embodiment shown, reaction rod flexure assembly 108 is centered in the y-direction along motor coil 106 so as to be in line with the force generated by motor coil 106. Reaction rod flexure assembly 108 is also located in the z-direction at a point substantially in line with the bottom portion 106a of motor coil 106. Reaction rod 108 may, however, be located at substantially anywhere along the z-axis of motor coil 106 suitable to absorb the inertial force of the channel in the x-direction.

Also, as can be seen more clearly in FIG. 5 magnet channel 107 is attached directly to countermass portion 120 of the stage assembly via bracket 121. By being fixedly attached to countermass portion 120, as motor coil moves within magnet channel 107, additional undesirable forces may be transferred into countermass 120 that are not absorbed by reaction rod 108.

Figure 6:
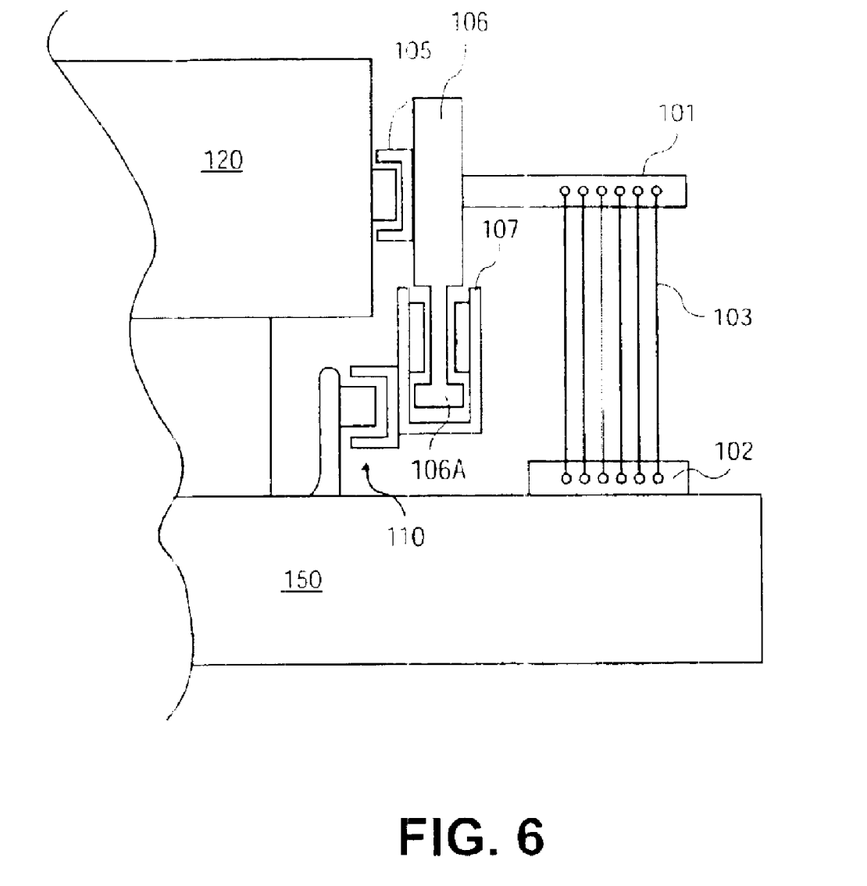
FIG. 6 is an end view illustrating an embodiment of the wafer stage assembly of FIG. 4 having a bearing guide assembly affixed to a base or ground portion.

In order to substantially isolate forces caused by movement of tube stage 104, magnet channel 107 is connected to a bearing guide assembly 110 as seen in FIG. 6. By mounting magnet channel 107 in this fashion, the tube carrier assembly as a whole, which includes one or more of tube stage 104, tube carrier portion 102, tube carrier portion 101, conduits tube 103, motor coil 106 magnet, magnet channel 107, may be substantially isolated from the wafer stage assembly tha includes wafer stage 132. The term substantially isolated, as used herein, is intended to define a state whereby the various inputs may be transmitted from the tube stage 104 to the wafer stage assembly without transmission of inertial forces from the tube carrier assembly to the wafer stage assembly. In the embodiment shown, this isolation is accomplished via bearing guide assembly 110.

Bearing guide assembly 110 comprises a bearing guide as well as a device for affixing the guide to a desired location. In one embodiment, bearing assembly 110 may comprise a single guide element that extends the entire length of magnet channel 107 or, in an alternative embodiment, it may comprise two or more guide elements spaced along the length of magnet channel 107. If multiple guide elements are used there may be one located at each end of magnet channel 107 with one or more optional guide elements located in between as is desired. Bearing guide assembly 110 may comprise, for example, one or more air bearings such as those produced by New Way Machine Components, Inc. located in Aston, Pa. or other suitable air bearings known in the art. Bearing guide assembly 110 may also comprise a roller bearing as well as any other suitable bearing device known in the art.

Figure 7:
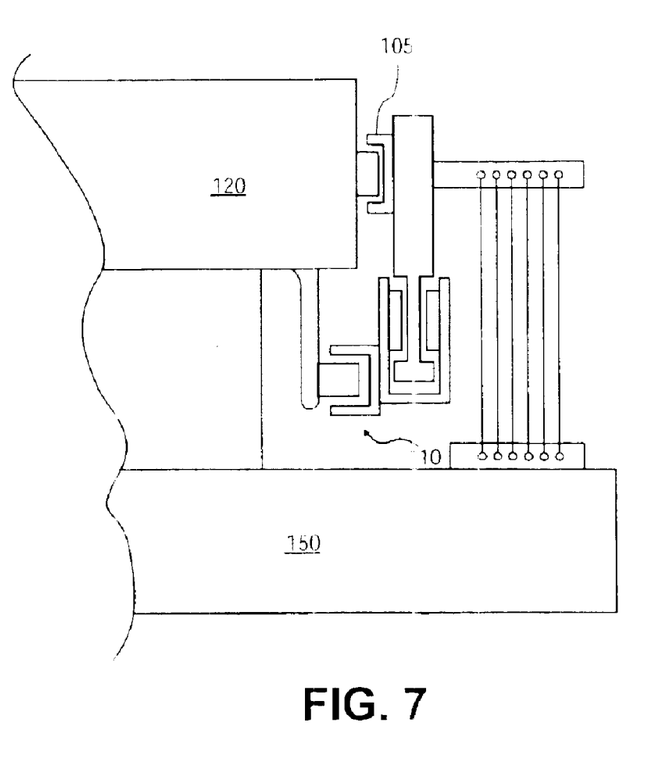
FIG. 7 is an end view illustrating an alternative embodiment of the bearing guide assembly of FIG. 6 wherein the bearing guide assembly is affixed to the stage assembly.

Bearing guide assembly 110 may in turn be connected to a base or ground portion 150. The addition of bearing guide assembly 110, therefore compensates for a substantial portion of additional forces not compensated by reaction rod 108 by allowing magnet 107 to essentially float within bearing guide assembly 110. By doing so, magnet 107 substantially does not transmit forces into countermass 120 of the stage assembly. In an additional embodiment as seen in FIG. 7, bearing guide assembly 110 may be connected to countermass 120. Even though magnet 107 is connected to countermass 120, this indirect connection through bearing guide assembly 110 provides the same reduction in force as when bearing guide assembly 110 is connected to ground portion 150. Ground portion 150 may comprise the floor of the building where the apparatus is housed or any other suitably large mass capable of receiving inertial forces so as to prevent interference with the apparatus by the inertial forces.

Figure 8:
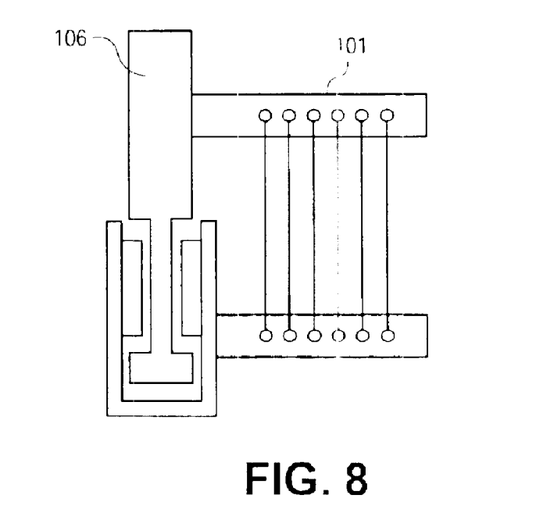
FIG. 8 is a perspective view illustrating an alternative configuration utilizing a reaction mass assembly for absorbing inertial forces created by the tube carrier.

As mentioned previously, conduit (tube coil) 103 can provide a spring force that may also be undesirable. As depicted in FIG. 7, lower tube carrier 102 is connected to ground portion 150. If the spring force generated by conduit (tube coil) 103 is relatively small in comparison to the forces created by the movement of motor coil 106, then connection to ground portion 150 is a suitable configuration. If, however, the spring force is substantial in relation to the forces generated by motor coil 106, then it may be desirable to affix lower tube carrier 102 to the side of magnet channel 107, as seen in FIG. 8. By affixing lower tube carrier 102 to magnet channel 107, substantially all of the spring force of conduit (tube coil) 103 is maintained within the tube carrier itself and the spring force may thus cancel itself out.

Additionally, it may be preferable to mount upper tube carrier 101 at a point along tube stage 104 substantially at the same level in the z-direction as the level where tube stage 104 rides along stage guide 105, as is depicted. If upper tube carrier 101 is mounted at a different position in the z-direction along tube stage 104 a moment force may be created between the two. By mounting upper tube carrier 101 in line with stage guide 105, this undesirable moment force may be eliminated.

While this tube carrier reaction frame has been described in conjunction with a wafer stage assembly table utilizing a reaction frame system, a similar tube carder reaction system may be used with a stage assembly utilizing a reaction mass configuration whereby a separate reaction frame is used solely for the tube carrier and a mass reaction system is used for the remainder of the stage assembly.

Figure 9:
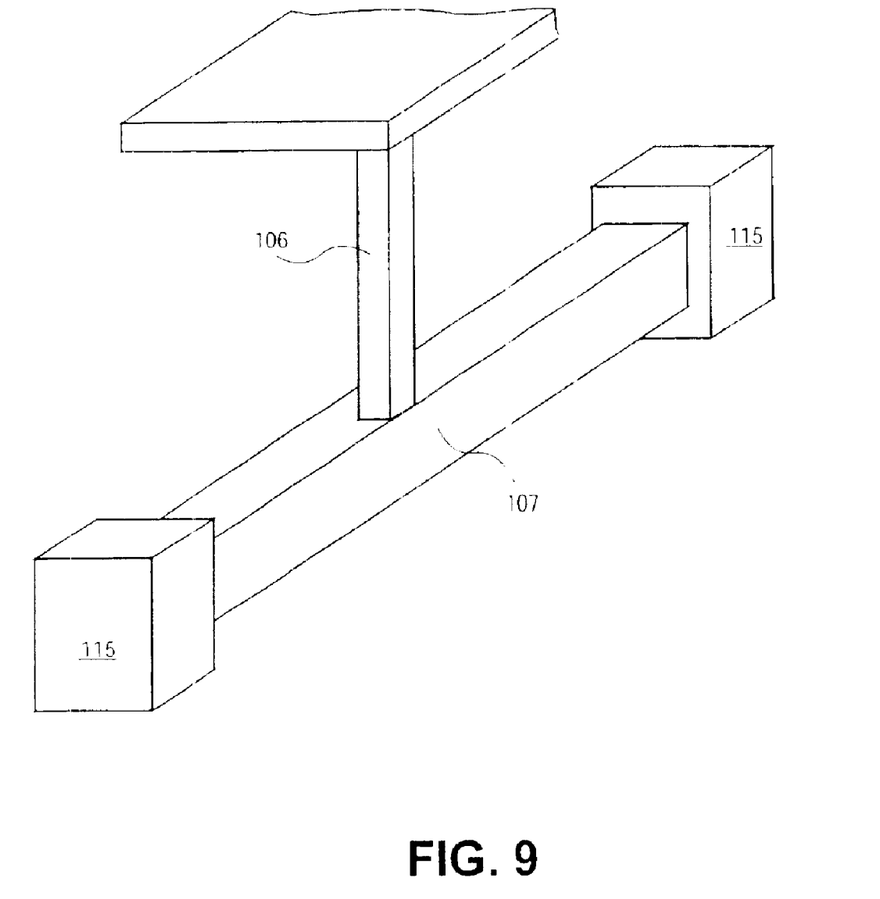
FIG. 9 is an end view illustrating alternative configuration of the tube carrier of FIG. 4.

In an alternative embodiment depicted in FIG. 9, rather than using a reaction frame to absorb the inertial forces of magnet channel 107, a separate reaction mass system could be employed. With this configuration, large masses are affixed to either end of magnet channel 107. Motor coil 106 operates in the same fashion as described above to propel tube stage 104, but rather than utilizing a flexure assembly, the inertial forces of magnet channel 107 are absorbed through conservation of momentum. End pieces 115 need to have a suitable mass to properly absorb these inertial forces. Greater inertial forces will require greater mass for end pieces 115 and vice versa.

Figure 10:
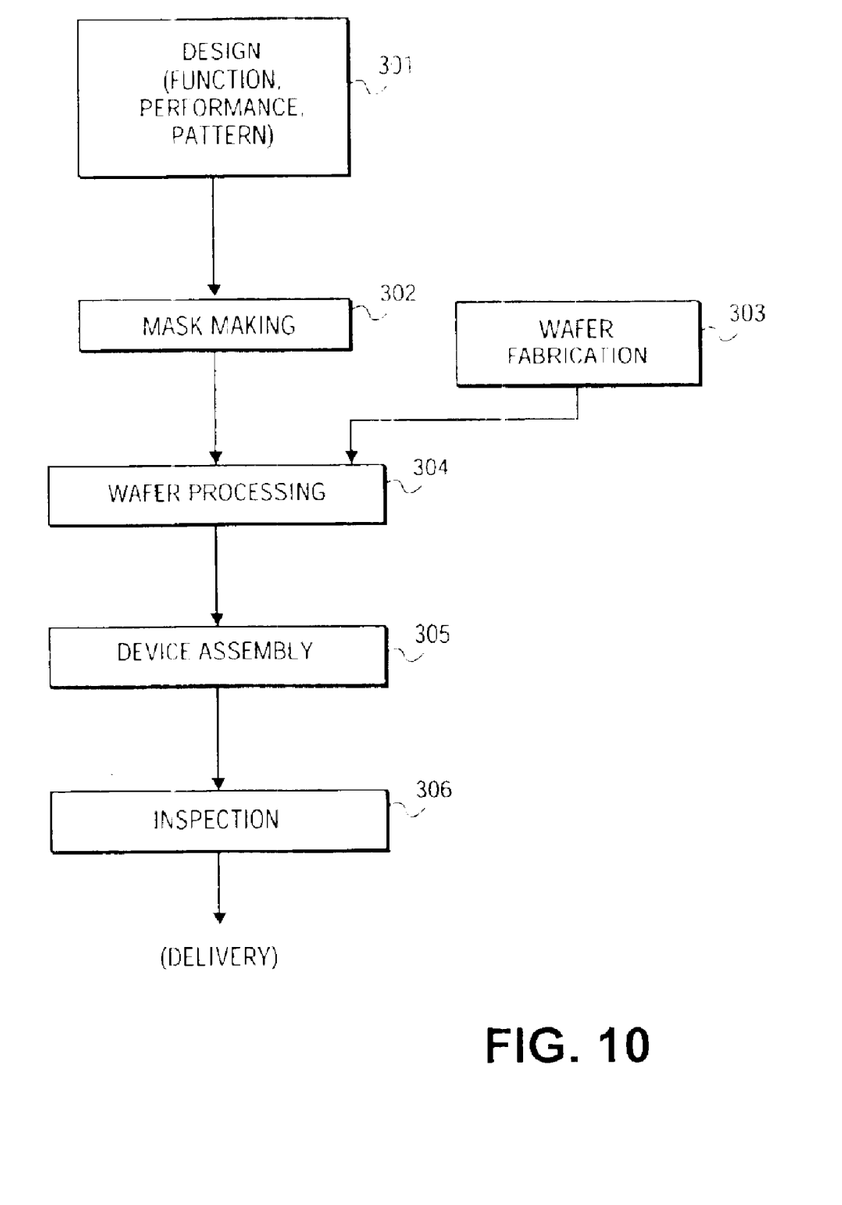
FIG. 10 is a flow chart outlining a process for manufacturing a semiconductor wafer consistent with the principles of the present invention.

The process of fabricating semiconductor devices will now be described with reference to the flowchart of FIG. 10. In step 301 the device's function and performance characteristics are designed. Next, in step 302, a reticle having a pattern is designed according to the previous designing step, and in a parallel step 303, a wafer is made from a silicon material. The reticle pattern designed in step 302 is exposed onto the wafer from step 303 in step 304 by a photolithography system described hereinabove consistent with the principles of the present invention. In step 305 the semiconductor device is assembled (including the dicing process, bonding process and packaging process). Finally, the device is inspected in step 306.

Figure 11:
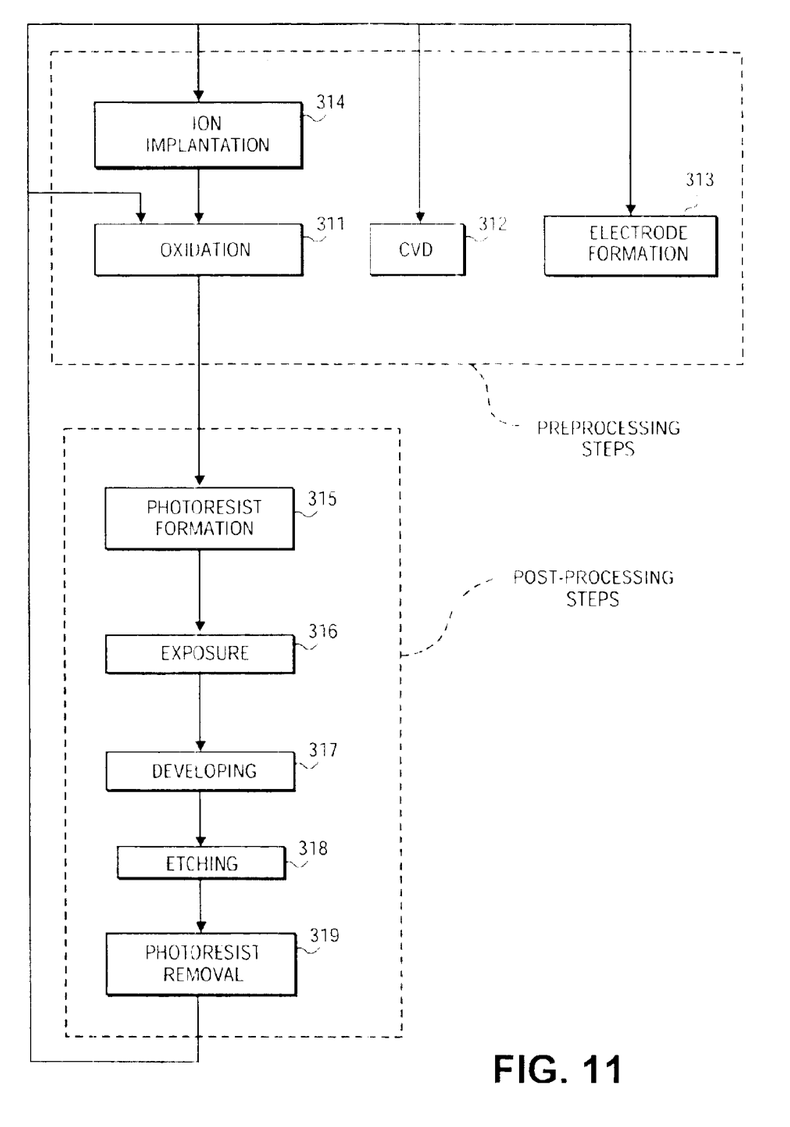
FIG. 11 is a flow chart outlining the semiconductor manufacturing process in more detail.

In the case of fabricating semiconductor devices, step 304 includes the additional steps detailed in the flowchart of FIG. 11. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the pre-processing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), a photoresist is applied to a wafer. Next, in step 316, (exposure step), the above mentioned exposure device is used to transfer the circuit pattern of a reticle to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these preprocessing and post-processing steps.

The use of the exposure apparatus provided herein is not limited to a photolithography system for manufacturing semiconductors. The exposure apparatus, for example, can be used as an LCD photolithography system that exposes a liquid crystal display device pattern onto a rectangular glass plate or a photolithography system for manufacturing a thin film magnetic head.

A photolithography system according to the above-described embodiments can be built by assembling various subsystems, including each element listed in the appended claims, in such a manner that the prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes integrating mechanical interfaces, electrical circuit wiring connections and air pressure plumbing connections between each subsystem. There is also a process where each subsystem is assembled prior to assembling a photolithography system from the various subsystems. Once a photolithography system is assembled using the various subsystems, a total adjustment is performed to make sure that as much accuracy is maintained in the complete photolithography system as possible. Additionally, it is desirable to manufacture an exposure system in a clean room where the temperature and purity are controlled.

It will be apparent to those skilled in the art that various modifications and variations can be made in the lens cell assembly and the methods described, the material chosen for the present invention, and in construction of the photolithography systems as well as other aspects of the invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An apparatus for manufacturing a product, comprising:
a product stage assembly, including a movable product stage, the product stage assembly having at least one input supplied by at least one tube;
a tube carrier assembly that positions the at least one tube relative to the product stage assembly; and
a reaction apparatus to absorb inertial forces created by tube carrier assembly movement substantially independently of inertial forces created by movable product stage movement,
wherein the tube carrier assembly is substantially isolated from the product stage assembly.

2. The apparatus of claim 1, said tube carrier assembly further comprising a tube stage and a tube stage guide associated with the tube stage to guide movement of the tube stage along the product stage assembly.

3. The apparatus of claim 2, said tube carrier assembly further comprising a linear motor associated with the tube stage to position the tube stage along the tube stage guide in correspondence with movement of the movable product stage.

4. The apparatus of claim 3, said linear motor fixedly mounted to a portion of the product stage assembly.

5. The apparatus of claim 1, said at least one input comprising at least one of vacuum power, air power, and electric power.

6. The apparatus of claim 1, said reaction apparatus comprising a reaction frame associated with the tube carrier assembly.

7. The apparatus of claim 3, said reaction apparatus comprising a reaction frame having at least one flexure assembly associated with the linear motor for absorbing the inertial forces.

8. The apparatus of claim 1, said reaction apparatus comprising a reaction mass assembly associated with the tube carrier.

9. The apparatus of claim 3, said reaction apparatus comprising a reaction mass assembly associated with the linear motor.

10. The apparatus of claim 1, further comprising an additional reaction apparatus associated with the product stage assembly that absorbs inertial forces created by movement of the product stage mover.

11. The apparatus of claim 1, said product comprising a wafer.

12. The apparatus of claim 1, further comprising an exposure apparatus.

13. An apparatus for manufacturing a product, comprising:
a product stage assembly, including a movable product stage, the product stage assembly having at least one input supplied by at least one tube;
a tube carrier assembly that positions the at least one tube relative to the product stage assembly; and
a reaction apparatus to absorb inertial forces created by tube carrier assembly movement substantially independently of inertial forces created by movable product stage movement,
wherein said tube carrier assembly further comprises a tube stage and a tube stage guide associated with the tube stage to guide movement of the tube stage along the product stage assembly,
wherein said tube carrier assembly further comprises a linear motor associated with the tube stage to position the tube stage along the tube stage guide in correspondence with movement of the movable product stage,
wherein said linear motor is substantially isolated from the product stage assembly.

14. The apparatus of claim 13, said linear motor comprising a motor having a motor coil associated with the tube stage and a magnetic stator channel for receiving the motor coil.

15. The apparatus of claim 13, further comprising a bearing guide assembly associated with the stator channel to substantially isolate the tube carrier assembly from the product stage assembly.

16. The apparatus of claim 15, said bearing guide assembly facilitating movement of the stator channel in a substantially linear direction in reaction to movement of the motor coil.

17. The apparatus of claim 16, said bearing guide assembly fixedly mounted to the stage assembly.

18. The apparatus of claim 16, said bearing guide assembly fixedly mounted to ground.

19. The apparatus of claim 17, said bearing guide assembly comprising one guide element extending substantially along an entirety of the stator channel in the substantially linear direction.

20. The apparatus of claim 17, said bearing guide assembly comprising a plurality of guide elements spaced along the stator channel.

21. The apparatus of claim 20, said plurality of guide elements comprising at least one guide element located substantially at either end of the stator channel.

22. The apparatus of claim 21, said plurality of guide elements further comprising at least one additional guide element located substantially at a mid-point of the stator channel.

23. The apparatus of claim 15, said bearing guide assembly comprising at least one of an air bearing and a roller bearing.

24. An apparatus for manufacturing a product, comprising:
a product stage assembly, including a movable product stage, the product stage assembly having at least one input supplied by at least one tube;
a tube carrier assembly that positions the at least one tube relative to the product stage assembly; and
a reaction apparatus to absorb inertial forces created by tube carrier assembly movement substantially independently of inertial forces created by movable product stage movement,
wherein said tube carrier assembly further comprises a tube stage and a tube stage guide associated with the tube stage to guide movement of the tube stage along the product stage assembly,
wherein said tube carrier assembly further comprises a linear motor associated with the tube stage to position the tube stage along the tube stage guide in correspondence with movement of the movable product stage,
wherein said reaction apparatus comprises a reaction mass assembly associated with the linear motor,
wherein said reaction mass assembly comprises a reaction mass located at either end of the linear motor.

25. A method of operating a product stage assembly, comprising:
independently positioning a tube carrier assembly in conjunction with movement of a movable product stage to which at least one input is supplied from at least one tube; and
absorbing inertial forces created by movement of the tube carrier assembly substantially independently of inertial forces created by movement of the moveable product stage,
wherein the tube carrier assembly is substantially isolated from the product stage assembly.

26. The method of claim 25, wherein the product stage assembly comprises a wafer stage assembly and the movable product stage comprises a movable wafer stage.

27. A method for making an object by a photolithography process, the process comprising independently positioning a tube carrier assembly in conjunction with movement of a movable product stage to which at least one input is supplied from at least one tube; and
absorbing inertial forces created by movement of the tube carrier assembly substantially independently of inertial forces created by movement of the moveable product stage,
wherein the tube carrier assembly is substantially isolated from the moveable product stage.

28. An apparatus that manufactures a product, comprising:
a stage assembly, including a movable stage, the stage assembly having at least one input supplied by at least one tube;
a moving member that moves in a direction opposite to the direction of the movement of the movable stage, the moving member absorbing a reaction force created by movable stage movement; and
a tube carrier assembly connected to the least one tube, the tube carrier assembly positioning the at least one tube relative to the stage assembly and comprising a tube stage and a tube stage guide associated with the tube stage to guide movement of the tube stage, the tube stage being connected to the moving member.

29. The apparatus of claim 28, further comprising a reaction apparatus that absorbs inertial forces created by tube carrier assembly movement substantially independently of inertial forces created by movable stage movement.

30. The apparatus of claim 28, wherein said tube carrier assembly comprises a drive device to position the tube stage in correspondence with movement of the movable stage, at least a portion of the drive device being connected to the moving member.

31. An apparatus that manufactures a product, comprising:
a stage assembly, including a movable stage, the stage assembly having at least one input supplied by at least one tube;
a moving member that moves in a direction opposite to the direction of the movement of the movable stage, the moving member absorbing a reaction force created by movable stage movement; and
a tube carrier assembly connected to the at least one tube, the tube carrier assembly positioning the at least one tube relative to the stage assembly and comprising a drive device to position the tube stage in correspondence with movement of the movable stage, at least a portion of the drive device being connected to the moving member.

32. The apparatus of claim 31, further comprising a reaction apparatus that absorbs inertial forces created by tube carrier assembly movement substantially independently of inertial forces created by movable stage movement.

33. The apparatus of claim 31, wherein said drive device is connected to the moving member via a bearing device that allows movement of the at least part of the drive device relative to the moving member.

* * * * *